US009385170B2

(12) United States Patent
Jeon et al.

(10) Patent No.: US 9,385,170 B2
(45) Date of Patent: Jul. 5, 2016

(54) THIN FILM TRANSISTOR ARRAY PANEL AND ORGANIC LIGHT EMITTING DIODE DISPLAY INCLUDING THE SAME

(71) Applicant: Samsung Display Co., Ltd., Yongin, Gyeonggi-Do (KR)

(72) Inventors: Woo-Sik Jeon, Yongin (KR); Young-Mo Koo, Yongin (KR); Min-Woo Lee, Yongin (KR); Jae-Goo Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/063,927

(22) Filed: Oct. 25, 2013

(65) Prior Publication Data

US 2014/0124761 A1 May 8, 2014

(30) Foreign Application Priority Data

Nov. 6, 2012 (KR) ........................ 10-2012-0124938

(51) Int. Cl.
*H01L 27/32* (2006.01)
*H01L 51/52* (2006.01)

(52) U.S. Cl.
CPC .......... *H01L 27/3244* (2013.01); *H01L 27/322* (2013.01); *H01L 27/3272* (2013.01); *H01L 51/5262* (2013.01); *H01L 51/5281* (2013.01)

(58) Field of Classification Search
CPC .. H01L 27/32; H01L 27/3225; H01L 27/3237
See application file for complete search history.

(56) References Cited

U.S. PATENT DOCUMENTS

| | | | | |
|---|---|---|---|---|
| 8,040,589 | B2 | 10/2011 | Bita et al. | |
| 2005/0140879 | A1* | 6/2005 | Nam | 349/114 |
| 2005/0179625 | A1* | 8/2005 | Choi et al. | 345/76 |
| 2006/0098285 | A1 | 5/2006 | Woodgate et al. | |
| 2010/0085642 | A1 | 4/2010 | Drinkwater | |
| 2010/0302802 | A1 | 12/2010 | Bita et al. | |
| 2011/0149217 | A1* | 6/2011 | Yoon | 349/106 |
| 2012/0026576 | A1 | 2/2012 | Bita et al. | |

FOREIGN PATENT DOCUMENTS

| | | | |
|---|---|---|---|
| KR | 10-2005-0121691 | A | 12/2005 |
| KR | 10-0761081 | B | 9/2007 |
| KR | 10-2011-0120718 | A | 11/2011 |

* cited by examiner

*Primary Examiner* — Shaun Campbell
*Assistant Examiner* — Aneta Cieslewicz
(74) *Attorney, Agent, or Firm* — Robert E. Bushnell, Esq.

(57) ABSTRACT

A thin film transistor array panel according to an exemplary embodiment includes: a substrate; a thin film transistor positioned on the substrate; a first electrode connected to the thin film transistor; and a diffractive layer positioned between the substrate and the thin film transistor. The diffractive layer is positioned within a boundary line of semiconductors of the thin film transistor.

14 Claims, 8 Drawing Sheets

195 70 710 720 730 82 177b 167 155b 176b 166 190 180 160 140 122 120 100 240 300 1356b 1355b 1357b 135b 220R 220G 220B 172
158
138
80
140
176b
166
155b
1356b
167
1355b
135b
177b
1357b
82
195
300
730
70
720
710
300
167
1357a
177a
155a
1355a
135a
166
1356a
190
180
176a
160
140
124
122
120
111

THIN FILM TRANSISTOR ARRAY PANEL AND ORGANIC LIGHT EMITTING DIODE DISPLAY INCLUDING THE SAME

CLAIM PRIORITY

This application makes reference to, incorporates into this specification the entire contents of, and claims all benefits accruing under 35 U.S.C. §119 from an application earlier filed in the Korean Intellectual Property Office filed on Nov. 6, 2012 and there duly assigned Serial No. 10-2012-0124938.

BACKGROUND OF THE INVENTION

1. Field of the Invention

The present invention relates generally to a thin film transistor array panel, and an organic light emitting diode display.

2. Description of the Related Art

An organic light emitting diode display is a self-light emitting display device including an organic light emitting diode for emitting light to display an image. Unlike a liquid crystal display, the organic light emitting diode display does not require a separate light source so that a thickness and weight thereof may be relatively decreased. Furthermore, since the organic light emitting diode display exhibits a high grade characteristic, such as low power consumption, high luminance, and a high response speed, thereby having attracted attention as a next generation display of a portable electronic device.

The organic light emitting diode display is classified into a passive matrix type and an active matrix type according to a driving method. The active matrix-type organic light emitting diode display includes an organic light emitting diode, a thin film transistor (TFT), and a capacitor for each pixel to independently control the pixel.

The organic light emitting diode display has a characteristic in that optical efficiency is lower than that of another display device, such as a CRT, a PDP, and a PED.

This causes a problem in that light emitted from the organic light emitting diode display is totally reflected from an interface between an electrode and a substrate and an interface between the substrate and the air, so that a light extraction ratio deteriorates, and light emitted from the organic light emitting diode display is confined between the electrode, an organic layer, and the substrate, so that the light fails to be emitted to the outside and dissipates.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide an organic light emitting diode display having the advantage of improving optical efficiency. An exemplary embodiment provides a thin film transistor array panel, including: a substrate; a thin film transistor positioned on the substrate; a first electrode connected to the thin film transistor; and a diffractive layer positioned between the substrate and the thin film transistor. The diffractive layer is positioned within a boundary line of semiconductors of the thin film transistor.

The thin film transistor array panel may further include: gate lines formed on the substrate and connected to the gate electrode of the thin film transistor; and data lines crossing the gate lines, and connected to a source electrode of the thin film transistor. The diffractive layer may overlap at least one of the gate line and the data line.

The diffractive layer may include a plurality of linear patterns formed of a reflective material, and the linear patterns may be arranged at a predetermined interval.

An interval between the linear patterns may be 50 nm to 5 μm.

The reflective material may be a material having reflectance of 50% or more, and the reflective material may include at least one of Al, Ag, Cu, Pd, Au, Ti, Mo, and oxide thereof.

Another exemplary embodiment provides an organic light emitting diode display, including: a substrate; and a plurality of pixels positioned on the substrate. Each of the plurality of pixels includes: a diffractive layer positioned on the substrate; a thin film transistor positioned on the diffractive layer; a first electrode connected to the thin film transistor; an organic emission layer positioned on the first electrode; and a second electrode positioned on the organic light emitting layer. The diffractive layer is positioned within a boundary line of semiconductors of the thin film transistor.

The thin film transistor may include a first thin film transistor and a second thin film transistor, and the first electrode may be connected to a drain electrode of the first thin film transistor.

The organic light emitting diode display may further include: gate lines formed on the substrate; and data lines and driving voltage lines crossing the gate lines and separated from each other. A gate electrode, a source electrode, and a drain electrode of the second thin film transistor may be connected to the gate lines, the data lines, and a gate electrode of a first thin film transistor, respectively, and a source electrode of the first thin film transistor may be connected to the driving voltage line.

In the diffractive layer, a plurality of linear patterns may be arranged at a predetermined interval.

The pixel may include a red pixel, a green pixel, and a blue pixel, and the red pixel, the green pixel, and the blue pixel may have different intervals between the linear patterns.

The interval between the linear patterns may be formed in an order of the blue pixel<the green pixel<the red pixel.

The reflective material may be a material having reflectance of 50% or more, and the reflective material may include at least one of Al, Ag, Cu, Pd, Au, Ti, Mo, and oxide thereof.

According to the exemplary embodiment, when the reflective patterns are formed, optical efficiency of the organic light emitting diode display may be increased.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
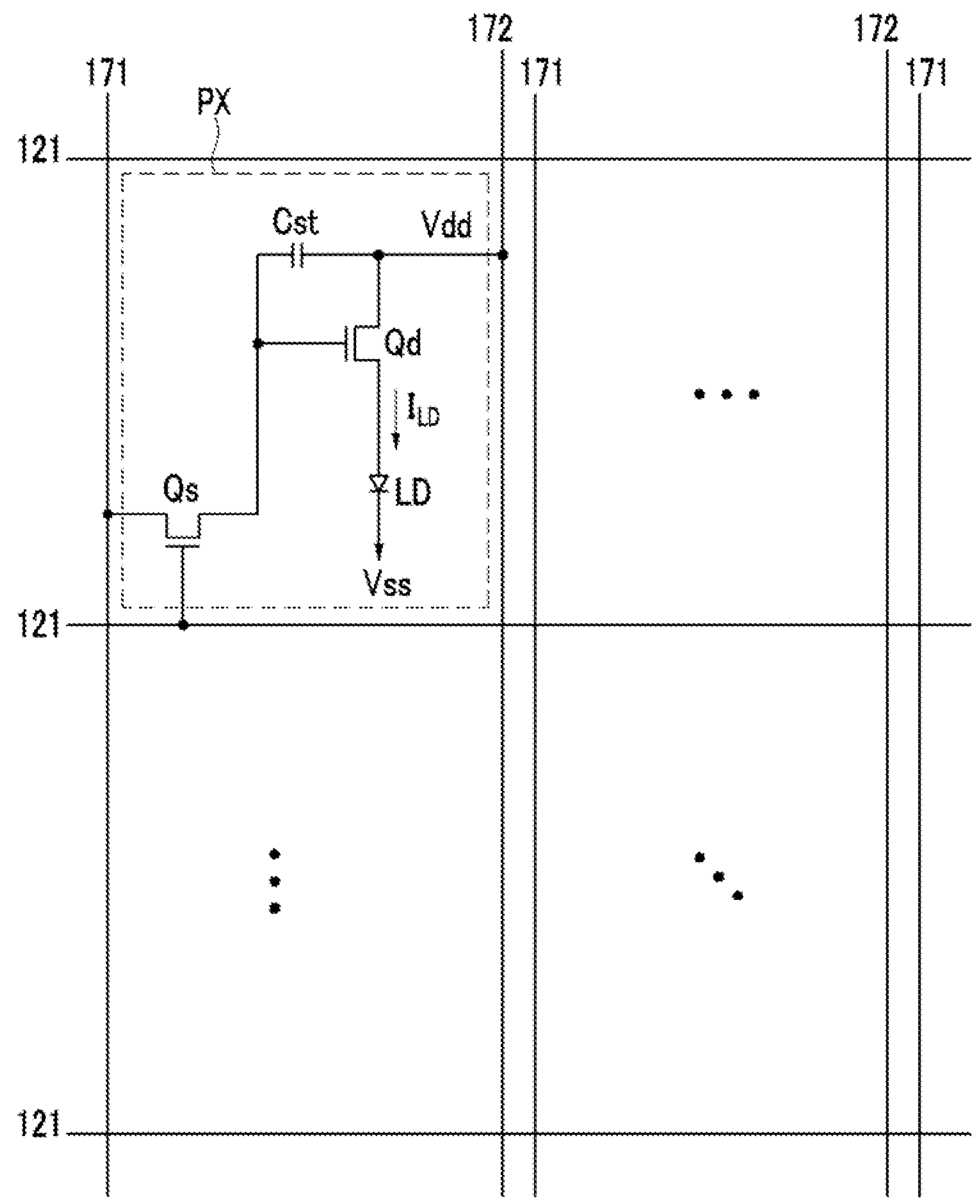
FIG. 1 is a circuit diagram illustrating a pixel circuit included in an organic light emitting diode display according to an exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that, when an element such as a layer, film, region, or substrate is referred to as being "on" another element, it can be directly on the other element or intervening elements may also be present. In contrast, when an element is referred to as being "directly on" another element, there are no intervening elements present.

Hereinafter, an organic light emitting diode display according to an exemplary embodiment will be described in detail with reference to the accompanying drawings.

FIG. 1 is a circuit diagram illustrating a pixel circuit included in an organic light emitting diode display according to an exemplary embodiment of the invention.

As shown in FIG. 1, the organic light emitting diode display according to the exemplary embodiment includes a plurality of signal lines 121, 171 and 172, and a plurality of pixels PX connected to the plurality of signal lines 121, 171 and 172 and arranged substantially in a matrix shape.

The signal lines include a plurality of gate lines 121 for transmitting a gate signal (or a scan signal), a plurality of data lines 171 for transmitting a data signal, and a plurality of driving voltage lines 172 for transmitting a driving voltage Vdd. The gate lines 121 extend substantially in a row direction and are almost parallel to each other, and vertical directional portions of the data lines 171 and the driving voltage lines 172 extend approximately in a column direction and are almost parallel to each other.

Each pixel PX includes a switching thin film transistor Qs, a driving thin film transistor Qd, a storage capacitor Cst, and an organic light emitting diode (OLED) LD.

The switching thin film transistor Qs includes a control terminal, an input terminal, and an output terminal, and the control terminal is connected to the gate line 121, the input terminal is connected to the data line 171, and the output terminal is connected to the driving thin film transistor Qd. The switching thin film transistor Qs transmits a data signal applied to the data line 171 to the driving thin film transistor Qd in response to a scan signal applied to the gate line 121.

The driving thin film transistor Qd also has a control terminal, an input terminal, and an output terminal, and the control terminal is connected to the switching thin film transistor Qs, the input terminal is connected to the driving voltage line 172, and the output terminal is connected to the organic light emitting diode LD. The driving thin film transistor Qd makes output current ILD flow, a size of which is changed according to a voltage applied between the control terminal and the output terminal.

The capacitor Cst is connected between the control terminal and the input terminal of the driving thin film transistor Qd. The capacitor Cst charges a data signal applied to the control terminal of the driving thin film transistor Qd and maintains the data signal after the switching thin film transistor Qs is turned off.

The organic light emitting diode LD includes an anode connected to the output terminal of the driving thin film transistor Qd and a cathode connected to a common voltage Vss. The organic light emitting diode LD emits light while changing intensity of light according to the output current ILD of the driving thin film transistor Qd to display an image.

Furthermore, a connection relation of the thin film transistors Qs and Qd, the capacitor Cst, and the organic light emitting diode LD may be changed.

Hereinafter, an organic light emitting diode display according to an exemplary embodiment will be described in detail with reference to FIGS. 2 and 3.

Figure 2:
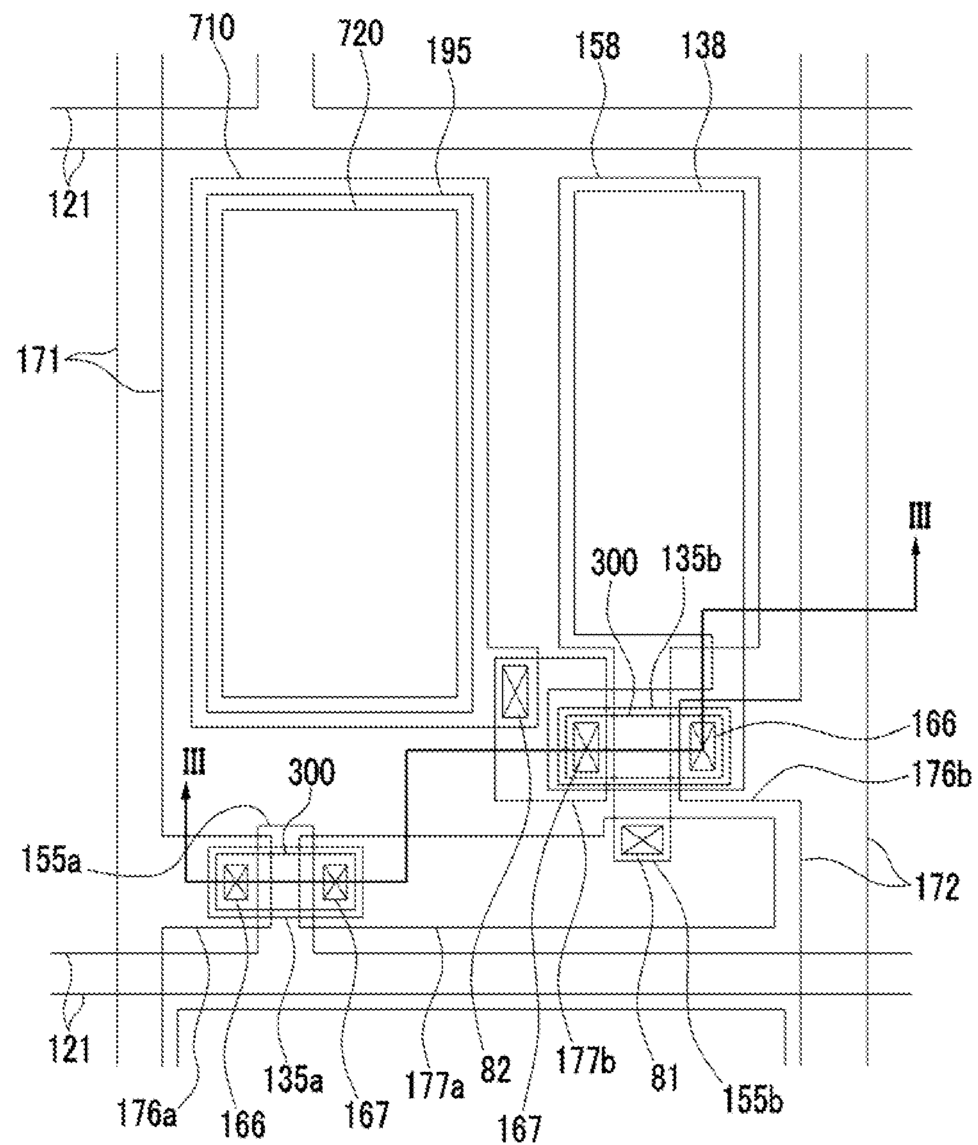
FIG. 2 is a layout view of one pixel of the organic light emitting diode display of FIG. 1.
Figure 3:
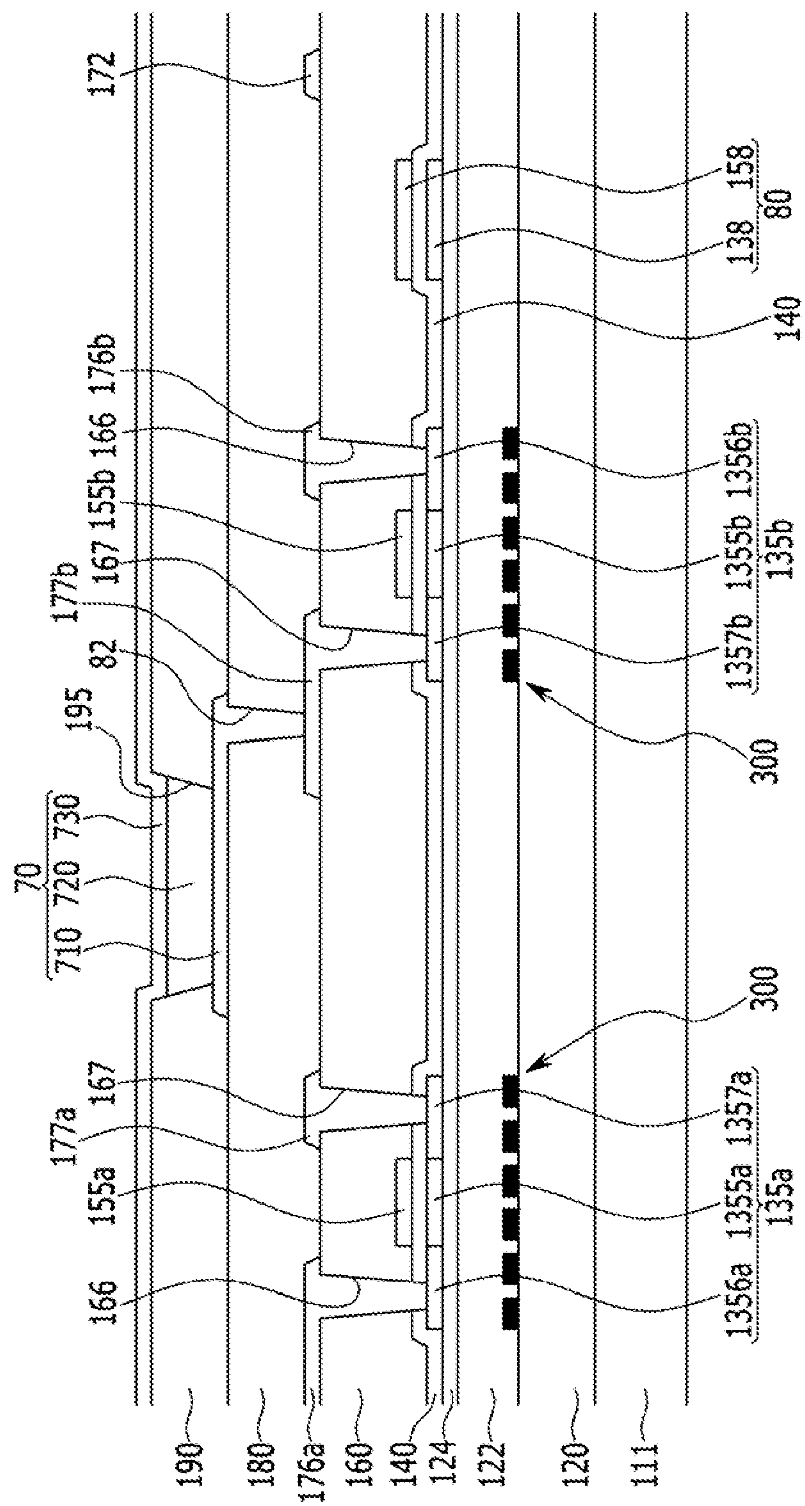
FIG. 3 is a cross-sectional view taken along line III-III of FIG. 2.
Figure 4:
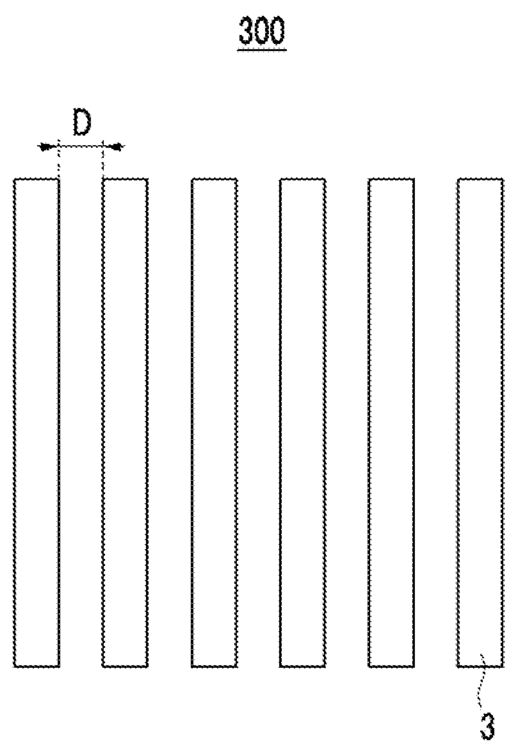
FIG. 4 is a top plan view of a diffractive layer according to the exemplary embodiment of the invention.
Figure 5:
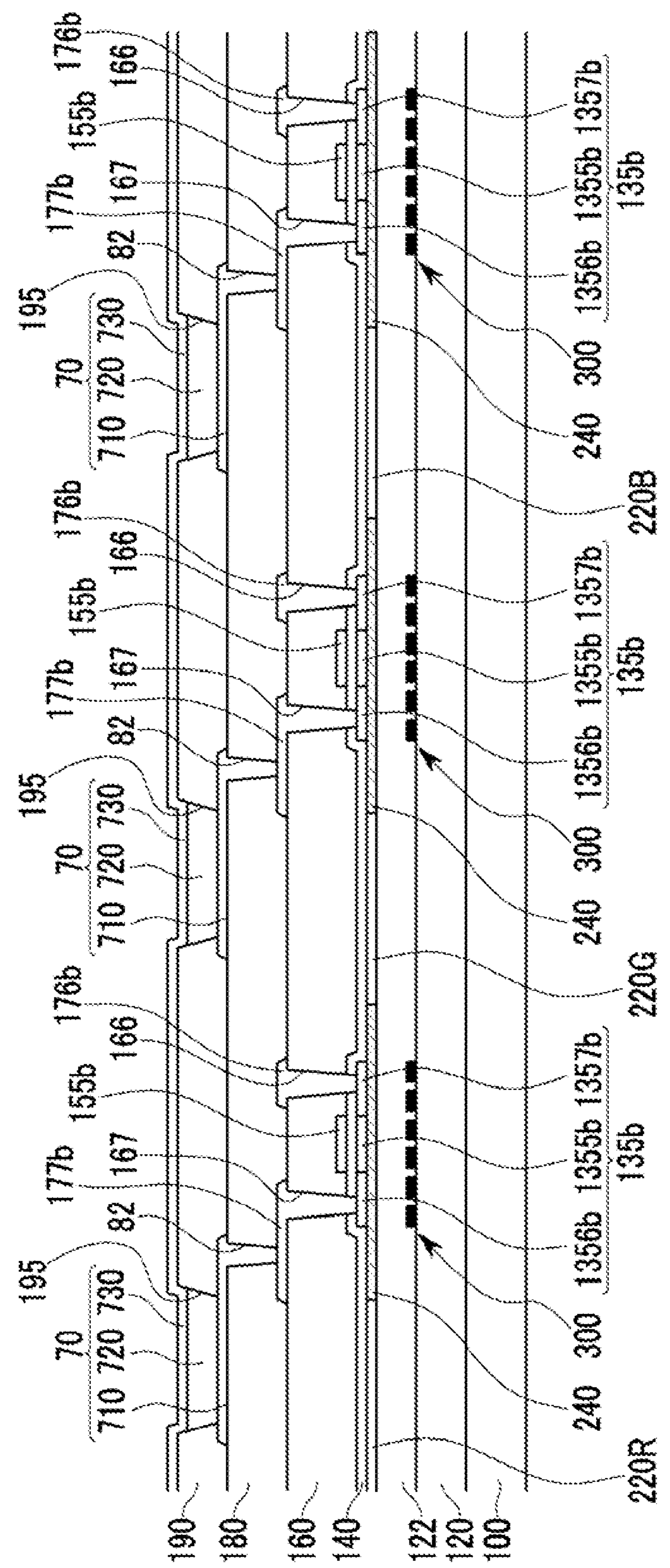
FIG. 5 is a cross-sectional view of an organic light emitting diode display according to another exemplary embodiment of the invention.

FIG. 2 is a layout view of one pixel of the organic light emitting diode display of FIG. 1, FIG. 3 is a cross-sectional view taken along line III-III of FIG. 2, FIG. 4 is a top plan view of a diffractive layer according to the exemplary embodiment of the invention, and FIG. 5 is a cross-sectional view of an organic light emitting diode display according to another exemplary embodiment of the invention.

As illustrated in FIGS. 2 and 3, a buffer layer 120, 122 and 124 is formed on a substrate 111.

The substrate 111 may be an insulating substrate made of glass, quartz, ceramic, or plastic, and the substrate 111 may be a metallic substrate made of stainless steel.

In the exemplary embodiment of FIG. 3, the buffer layer may include a lower layer 120, an intermediate layer 122 positioned on the diffractive layer 300, and an upper layer 124 positioned on the intermediate layer 122, but may include only the intermediate layer 122 formed according to necessity.

A diffractive layer 300 is formed on the lower layer 120 of the buffer layer.

Referring to FIG. 4, the diffractive layer 300 includes a plurality of linear patterns made of a reflective material. The linear patterns are arranged in parallel at a predetermined interval D, and the interval D may be 50 nm to 5 μm.

The reflective material is a metallic material with reflectance of 50% or more, and may be a single layer including at least one of Al, Ag, Cu, Pd, Au, Ti, Mo, and oxide thereof or a multilayer in which at least one of Al, Ag, Cu, Pd, Au, Ti, Mo, and oxide thereof is stacked.

The intermediate layer 122 of the buffer layer is formed on the diffractive layer 300.

The buffer layer may be formed as a single layer of silicon oxide or silicon nitride (SiNx), or as a multiple layer structure in which silicon nitride (SiNx) and silicon oxide (SiO2) are stacked. The intermediate layer 122 of the buffer layer serves to fill a space from the diffractive layer 300 to planarize a surface while preventing unnecessary ingredients, such as an impurity or moisture, from being penetrated. The intermediate layer 122 of the buffer layer may be formed so as to be thicker than the linear pattern, and may have a thickness equal to or larger than 100 nm or equal to or less than 5 μm.

A first semiconductor 135*a* and a second semiconductor 135*b* formed of polysilicon, and a first capacitor electrode 138 are formed on the buffer layer.

The first semiconductor 135*a* and the second semiconductor 135*b* are divided into channel regions 1355*a* and 1355*b*, and source regions 1356*a* and 1356*b* and drain regions 1357*a* and 1357*b* formed at respective sides of the channel regions 1355*a* and 1355*b*. The channel regions 1355*a* and 1355*b* of the first semiconductor 135*a* and the second semiconductor 135*b*, respectively, are polysilicon in which an impurity is not doped, that is, intrinsic semiconductors. The source regions 1356*a* and 1356*b* and the drain regions 1357*a* and 1357*b* of the first semiconductor 135*a* and the second semiconductor 135*b* are polysilicon in which a conductive impurity is doped, that is, impurity semiconductors.

The impurity doped in the source regions 1356*a* and 1356*b*, the drain regions 1357*a* and 1357*b*, and the first capacitor electrode 138 may be any one of a p-type impurity and an n-type impurity.

The diffractive layer 300 is positioned within a boundary line of the first semiconductor 135*a* and the second semiconductor 135*b* so as to prevent an aperture ratio from being decreased by the diffractive layer 300.

A gate insulating layer 140 is formed on the first semiconductor 135*a*, the second semiconductor 135*b*, and the first capacitor electrode 138. The gate insulating layer 140 may be a single layer or a multilayer including at least one of tetra ethyl ortho silicate (TEOS), silicon nitride, and silicon oxide.

Referring to FIGS. 2 and 3, gate lines 121, a second gate electrode 155*b*, and a second capacitor electrode 158 are formed on the gate insulating layer 140.

The gate line 121 elongates in a horizontal direction to transmit a gate signal, and includes a first gate electrode 155*a* protruding from the gate line 121 toward the first semiconductor 135*a*.

The first gate electrode 155*a* and the second gate electrode 155*b* overlap the channel regions 1355*a* and 1355*b*, respectively, and the second capacitor electrode 158 overlaps the first capacitor electrode 138.

The second capacitor electrode 158, the first gate electrode 155*a*, and the second gate electrode 155*b* may be formed as a single layer or a multilayer formed of molybdenum, tungsten, copper, aluminum, or an alloy thereof.

The first capacitor electrode 138 and the second capacitor electrode 158 form a capacitor 80 by using the gate insulating layer 140 as a dielectric.

A first interlayer insulating layer 160 is formed on the first gate electrode 155*a*, the second gate electrode 155*b*, and the second capacitor electrode 158. The first interlayer insulating layer 160 may also be formed of tetra ethyl ortho silicate (TEOS), silicon nitride, or silicon oxide, similar to the gate insulating layer 140.

The first interlayer insulating layer 160 and the gate insulating layer 140 include source contact holes 166 and drain contact holes 167 through which the source regions 1356*a* and 1356*b* and the drain regions 1357*a* and 1357*b* are exposed, respectively.

The data lines 171 including a first source electrode 176*a*, the driving voltage lines 172 including a second source electrode 176*b*, a first drain electrode 177*a*, and a second drain electrode 177*b* are formed on the first interlayer insulating layer 160.

The data line 171 transmits a data signal and extends in a direction crossing the gate line 121.

The driving voltage line 172 transmits a predetermined voltage, and extends in the same direction as that of the data line 171 while being separated from the data line 171.

The first source electrode 176*a* protrudes toward the first semiconductor 135*a* from the data line 171, and the second source electrode 176*b* protrudes toward the second semiconductor 135*b* from the driving voltage line 172. The first source electrode 176*a* and the second source electrode 176*b* are connected to the source regions 1356*a* and 1356*b*, respectively, through the source contact holes 166, respectively.

The first drain electrode 177*a* faces the first source electrode 176*a* and is connected to the drain region 1357*a* through a contact hole 167.

The first drain electrode 177*a* extends along the gate line 121, and is electrically connected to the second gate electrode 155*b* through a contact hole 81.

The second drain electrode 177*b* is connected to the drain region 1357*b* through a contact hole 167.

The data line 171, the driving voltage line 172, and the first drain electrode 177*a* may be formed as a single layer or a multilayer formed of a low resistance material, such as Al, Ti, Mo, Cu, Ni, or an alloy thereof, or a highly corrosive material. For example, the data line 171, the driving voltage line 172, and the first drain electrode 177*a* may be triple layers of Ti/Cu/Ti or Ti/Ag/Ti.

In the exemplary embodiment, a capacitor is formed by overlapping the first capacitor electrode 138 and the second capacitor electrode 158, but a capacitor having a metal/dielectric/metal structure may be formed by forming an electrode on the same layer as that of the data line or on the same layer as that of the first electrode.

A second interlayer insulating layer 180 is formed on the data line 171, the driving voltage line 172, and the first drain electrode 177*a*.

Furthermore, the first electrode 710 is formed on the second interlayer insulating layer 180. The first electrode 710 may be an anode electrode of the organic light emitting diode of FIG. 1. The first electrode 710 is connected to the second drain electrode 177*b* through a contact hole 82.

In the exemplary embodiment, the second drain electrode 177*b* and the first electrode 710 are connected through the contact hole 82 with the second interlayer insulating layer 180 interposed therebetween, but the second drain electrode 177*b* and the first electrode 710 may be integrally formed.

A pixel defining layer 190 is formed on the first electrode 710.

The pixel defining layer 190 includes an opening 195 through which the first electrode 710 is exposed. The pixel defining layer 190 may be formed of a polyacrylate-based or polyimide-based resin and a silica-based inorganic material.

An organic emission layer 720 is formed in the opening 195 of the pixel defining layer 190.

The organic emission layer 720 may be formed of a low molecular organic material or a high molecular organic material, such as Poly 3,4-ethylenedioxythiophene (PEDOT). Furthermore, the organic emission layer 720 may be formed as a multilayer including at least one of a light emission layer, a hole injection layer HIL, a hole transporting layer HTL, an electron transporting layer ETL, and an electron injection layer EIL. When the organic emission layer 720 includes all of the light emission layer, the hole injection layer HIL, the hole transporting layer HTL, the electron transporting layer ETL, and the electron injection layer EIL, the hole injection layer is disposed on the first electrode 710 that is an anode, and the hole transporting layer HTL, the light emission layer, the electron transporting layer ETL, and the electron injection layer EIL are sequentially stacked on the hole injection layer.

The organic emission layer 720 may include at least one of a red organic emission layer for emitting red light, a green organic emission layer for emitting green light, and a blue organic emission layer for emitting blue light, and the red organic emission layer, the green organic emission layer, and the blue organic emission layer are formed in a red pixel, a green pixel, and a blue pixel, respectively, to implement a color image.

Furthermore, the organic emission layer 720 may implement a white color by stacking the red organic emission layer, the green organic emission layer, and the blue organic emission layer in the red pixel, the green pixel, and the blue pixel, together, or a white organic emission layer for emitting white light may be formed in all of the red pixel, the green pixel, and the blue pixel. As illustrated in FIG. 5, when the plurality of emission layers is formed in one pixel or the white organic emission layer is formed, a color image may be implemented by forming a red color filter 220R, a green color filter 220G, and a blue color filter 220B for each pixel. In this case, a black matrix 240 may be formed between the color filters in order to prevent the colors emitted through the respective color filters 220R, 220G, and 220B from being mixed or interfering.

As illustrated in FIG. 5, when the color image is implemented by stacking the red, green, and blue emission layers or forming the white organic emission layer and using the color filters, it is not necessary to use a deposition mask for depositing the red organic emission layer, the green organic emission layer, and the blue organic emission layer in individual pixels, that is, the red pixel, the green pixel, and the blue pixel, respectively.

As described above, it is a matter of course that the white organic emission layer may be formed as one organic emission layer, and the white organic emission layer includes a configuration capable of emitting white light by stacking the plurality of organic emission layers.

In addition to the red emission layer, the green emission layer, and the blue emission layer, the white organic emission layer may also include a configuration capable of emitting white light by combining at least one yellow organic emission layer and at least one blue organic emission layer, a configuration capable of emitting white light by combining at least one cyan organic emission layer and at least one red organic emission layer, and a configuration capable of emitting white light by combining at least one magenta organic emission layer and at least one green organic emission layer.

Referring to FIG. 3, a second electrode 730 is formed on the pixel defining layer 190 and the organic emission layer 720.

The second electrode 730 is a cathode electrode of the organic light emitting diode. Accordingly, the second electrode 710, the organic emission layer 720, and the common electrode 730 form the organic light emitting diode 70.

The organic light emitting diode display may have any one structure among a top display type, a bottom display type, and a dual display type according to a direction of emitting light by the organic light emitting diode 70.

In a bottom display type organic light emitting diode display according to the exemplary embodiment, the first electrode 710 is formed as a transparent layer or a semi-transmitting layer, and the second electrode 730 is formed as a reflective layer. The reflective layer and the semi-transmitting layer are formed of at least one metal among magnesium (Mg), silver (Ag), gold (Au), calcium (Ca), lithium (Li), chromium (Cr), and aluminum (Al), or an alloy thereof. The reflective layer and the semi-transmitting layer are determined by thickness, and the semi-transmitting layer may be formed to have a thickness equal to or less than 200 nm. As thickness is decreased, transmittance of light is increased. However, when the thickness is excessively small, resistance is increased.

A transparent layer may be formed of a material, such as indium tin oxide (ITO), indium zinc oxide (IZO), zinc oxide (ZnO), or indium oxide (In2O3).

When the diffractive layer 300 is formed as described above, optical efficiency may be increased.

This will be described in detail with reference to FIGS. 6 and 7.

Figure 6:
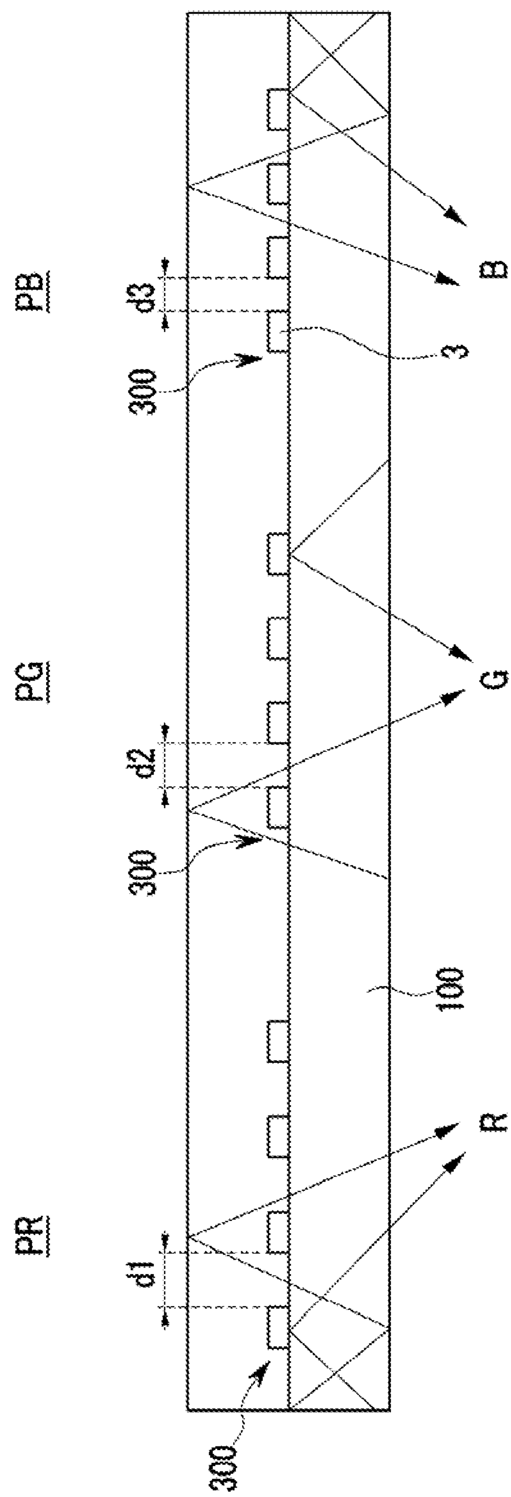
FIGS. 6 and 7 are drawings for describing optical efficiency of the organic light emitting diode display according to the present invention.
Figure 7:
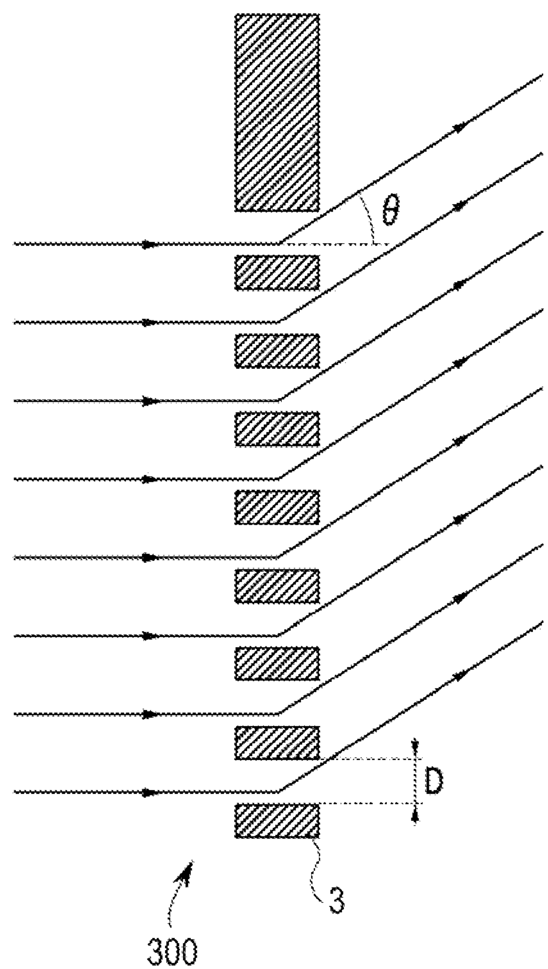

FIGS. 6 and 7 are drawings for describing optical efficiency of the organic light emitting diode display according to the present invention.

Referring to FIG. 6, light reflected between the substrate 100 and the air and light reflected between the substrate 100 and the electrode move along the substrate 100 and then reach the diffractive layer 300, and are reflected and refracted by the linear patterns 3 of the diffractive layer 300 so as to be emitted to the outside. That is, light moving along the substrate 100 is a mixture of all pixel colors in the related art so that, when the light moves along the substrate, the light may be mixed with each pixel color representing a predetermined color.

However, when the diffractive layer 300 is formed like the exemplary embodiment, the light moving along the substrate 100 is reflected by the linear patterns 3 formed of the reflective material, so that a refractive index is changed, and thus the light does not move along the substrate 100 any more, and may be emitted to the outside.

Furthermore, when an interval between the linear patterns 3 of the diffractive layer 300 is changed according to each pixel color, the light diffracted by the diffractive layer 300 may emit only the same color as the pixel color to the outside.

Referring to FIG. 7, when the light is incident to the diffractive layer 300, the incident light is diffracted by the linear patterns 3 and is emitted at an angle of θ. In this case, when the interval between the linear patterns 3 is referred to as d, a wavelength of the diffracted and emitted light may be obtained by an equation below.

$$d \sin \theta = \lambda/2\ 2\ m \qquad \text{[Equation]}$$

Accordingly, as illustrated in FIG. 5, the interval between the linear patterns of the diffractive layer 300 positioned at each of the red pixel, the green pixel, and the blue pixel may be differently formed according to the pixel color.

When the organic emission layer emits light of a single color, the pixel color is determined according to an emission color of the organic emission layer, but when the organic emission layer includes multiple colors to form the white light, the pixel color is changed according to a color of the color filter.

For example, when the organic light emitting diode display includes the red pixel PR, the green pixel PG, and the blue pixel PB, and the intervals between the linear patterns of the red pixel PR, the green pixel PG, and the blue pixel PB are referred to as d1, d2, and d3, respectively, the intervals between the linear patterns may have a relation of d1>d2>d3.

d1 may be 0.32±0.05 μm, 0.40±0.05 μm, 0.60±0.05 μm, 0.69±0.05 μm, and 2.00±0.05 μm, d2 may be 0.27±0.05 μm, 0.35±0.05 μm, 0.50±0.05 μm, 0.60±0.05 μm, 1.71±0.05 μm, and d3 may be 0.24±0.05 μm, 0.30±0.05 μm, 0.43±0.05 μm, 0.50±0.05 μm, 1.47±0.05 μm.

When the light moving along the substrate 100 is incident to the red pixel, the red light is emitted and the green light and the blue light dissipate, and when the light moving along the substrate 100 is incident to the green pixel, the green light is emitted and the blue light and the red light dissipate, and when the light moving along the substrate 100 is incident to the blue pixel, the blue light is emitted and the red light and the green light dissipate.

As described above, optical efficiency may be increased by discharging the light moving along the substrate 100 to the outside by using the diffractive layer 300.

Figure 8:
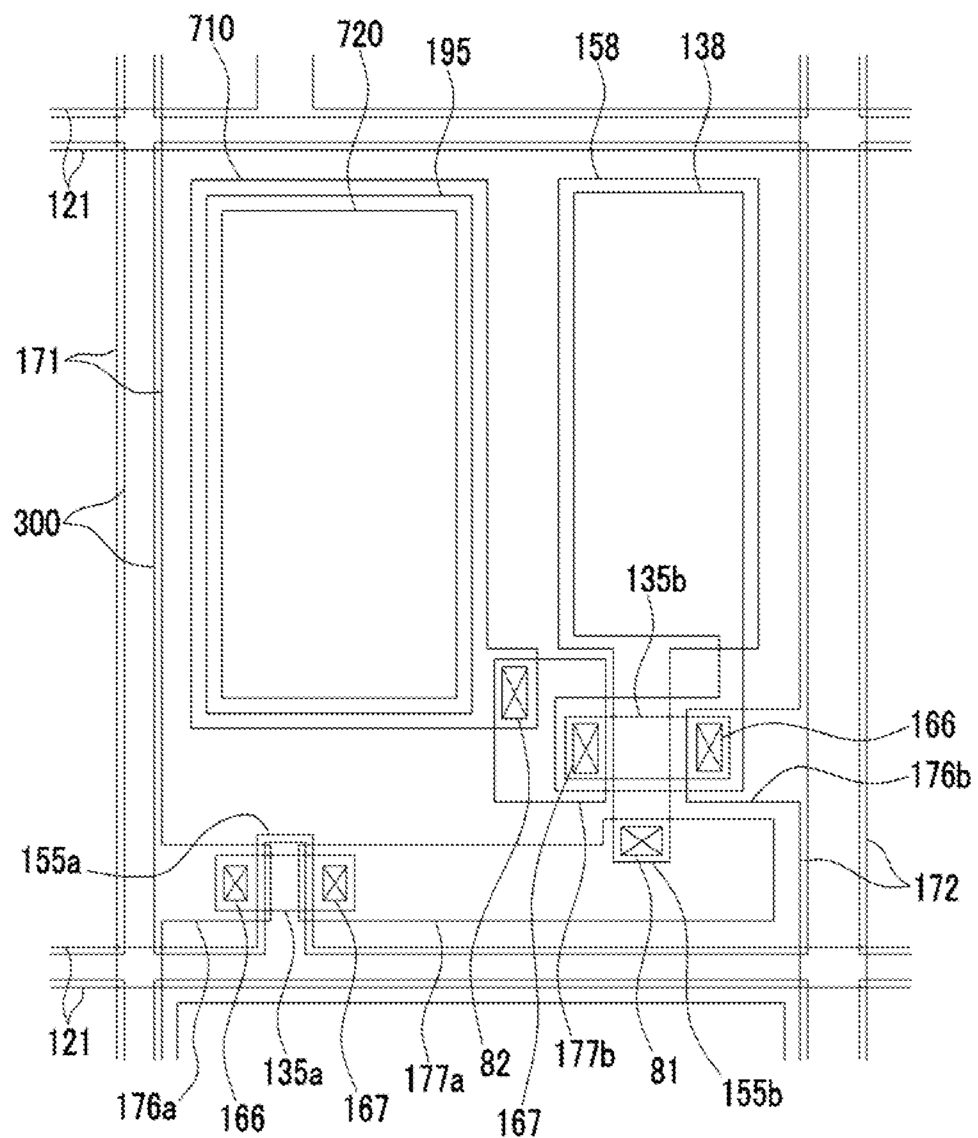
FIG. 8 is a layout view of an organic light emitting diode display according to another exemplary embodiment of the invention.

FIG. 8 is a layout view of the organic light emitting diode display according to another exemplary embodiment of the invention.

The exemplary embodiment of FIG. 8 is substantially the same as the exemplary embodiment of FIGS. 2 and 3, except for the form of the diffractive layer 300, so that a repeated description will be omitted.

As illustrated in FIG. 8, the diffractive layer 300 of the organic light emitting diode display of the present invention overlaps a data wiring and a gate wiring.

Particularly, the diffractive layer 300 overlaps the gate lines 121, the data lines 171, the first drain electrode 177*a*, the second drain electrode 177*b*, and the driving voltage line 172.

In this case, since the gate line 121, the data line 171, and the driving voltage line 172 are positioned between the adjacent pixels, the interval between the linear patterns of the diffractive layer 300 may be formed so as to emit the same color as that of the pixel connected to the signal lines.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:

a substrate;

a plurality of thin film transistors positioned on the substrate;

a first electrode connected to a thin film transistor among the plurality of thin film transistors; and a diffractive layer positioned between the substrate and the thin film transistor, the diffractive layer being positioned wholly within a boundary line of semiconductors of the thin film transistor and overlapping the semiconductors of the thin film transistor, the diffractive layer being disposed spaced apart from diffractive layers of other thin film transistors among the plurality of thin film transistors.

2. The thin film transistor array panel of claim 1, further comprising:

gate lines formed on the substrate and connected to a gate electrode of the thin film transistor; and data lines crossing the gate lines, and connected to a source electrode of the thin film transistor.

3. The thin film transistor array panel of claim 1, the diffractive layer comprising a plurality of linear patterns formed of a reflective material, and the linear patterns being arranged at a predetermined interval.

4. The thin film transistor array panel of claim 3, an interval between the linear patterns being 50 nm to 5 μm.

5. The thin film transistor array panel of claim 3, the reflective material being a material having a reflectance of at least 50%.

6. The thin film transistor array panel of claim 5, the reflective material including at least one of Al, Ag, Cu, Pd, Au, Ti, Mo, and oxide thereof.

7. An organic light emitting diode display, comprising:

a substrate; and a plurality of pixels positioned on the substrate, each of the plurality of pixels comprising a diffractive layer positioned on the substrate, a thin film transistor positioned on the diffractive layer, a first electrode connected to the thin film transistor, an organic emission layer positioned on the first electrode, and a second electrode positioned on the organic emission layer, wherein the diffractive layer of each pixel is positioned wholly within a boundary line of semiconductors of the thin film transistor of each pixel and overlapping the semiconductors of the thin film transistor of each pixel, and the diffractive layer of each pixel is disposed spaced apart from diffractive layers of other pixels among the plurality of pixels.

8. The organic light emitting diode display of claim 7, the thin film transistor comprising a first thin film transistor and a second thin film transistor; and the first electrode being connected to a drain electrode of the first thin film transistor.

9. The organic light emitting diode display of claim 8, further comprising:

gate lines formed on the substrate; and data lines and driving voltage lines crossing the gate lines and separated from each other;

a gate electrode, a source electrode, and a drain electrode of the second thin film transistor being connected to the gate lines, the data lines, and a gate electrode of a first thin film transistor, respectively; and a source electrode of the first thin film transistor being connected to the driving voltage line.

10. The organic light emitting diode display of claim 7, a plurality of linear patterns being arranged at a predetermined interval in the diffractive layer.

11. The organic light emitting diode display of claim 10, the pixel comprising a red pixel, a green pixel and a blue pixel, and the red pixel, the green pixel and the blue pixel having different intervals between the linear patterns.

12. The organic light emitting diode display of claim 11, the interval between the linear patterns being formed in an order of the blue pixel<the green pixel<the red pixel.

13. The organic light emitting diode display of claim 7, the diffractive layer comprising a plurality of linear patterns formed of a reflective material, and the reflective material being a material having a reflectance of at least 50%.

14. The organic light emitting diode display of claim 13, the reflective material including at least one of Al, Ag, Cu, Pd, Au, Ti, Mo, and oxide thereof.

* * * * *